United States Patent [19]
Chu et al.

[11] Patent Number: 5,228,502
[45] Date of Patent: Jul. 20, 1993

[54] COOLING BY USE OF MULTIPLE PARALLEL CONVECTIVE SURFACES

[75] Inventors: Richard C. Chu, Poughkeepsie; Gary F. Goth, Pleasant Valley; Gaetano P. Messina, Hopewell Junction; Kevin P. Moran, Wappingers Falls; Michael L. Zumbrunnen, Poughkeepsie, all of N.Y.

[73] Assignee: International Business Machines Corporation, Armonk, N.Y.

[21] Appl. No.: 754,855

[22] Filed: Sep. 4, 1991

[51] Int. Cl.$^5$ .......................... F28D 7/12; H05K 7/20
[52] U.S. Cl. .................... 165/80.4; 165/142; 165/908; 361/382; 361/385; 257/714
[58] Field of Search .............. 165/80.4, 155, 908, 165/142; 361/382, 385; 357/82

[56] References Cited

U.S. PATENT DOCUMENTS

| | | | |
|---|---|---|---|
| 2,273,257 | 2/1942 | Gardner | 165/142 |
| 4,072,189 | 2/1978 | Chaix et al. | 165/142 |
| 4,226,281 | 11/1980 | Chu | 165/80.1 |
| 4,452,233 | 6/1984 | Goodman, Jr. et al. | 165/142 |
| 4,574,877 | 3/1986 | Klein | 361/385 |
| 4,740,866 | 4/1988 | Kajiwara et al. | 165/80.4 |
| 4,750,086 | 6/1988 | Mittal | 361/385 |
| 4,759,403 | 7/1988 | Flint et al. | 165/80.4 |
| 4,882,654 | 11/1989 | Nelson et al. | 361/382 |
| 4,920,574 | 4/1990 | Yamamoto et al. | 361/385 |
| 4,977,444 | 12/1990 | Nakajima et al. | 361/382 |

FOREIGN PATENT DOCUMENTS

| | | | |
|---|---|---|---|
| 935813 | 10/1973 | Canada | 165/142 |
| 3317490 | 11/1984 | Fed. Rep. of Germany | 165/142 |
| 215968 | 9/1991 | Japan | 357/82 |

OTHER PUBLICATIONS

Pacuzzo, A. L. et al., "Integrated Circuit Module Package Cooling Structure", IBM Tech. Discl. Bull., vol. 20, No. 10, Mar. 1978, pp. 3898-3899.
Research Disclosure, Mar. 1990, No. 311 entitled "Annulus-Convection . . . Cooling".
IBM TDB, vol. 31, No. 5, Oct. 1988, entitled "Multi-Chip Package . . . Within Its Pins" pp. 141-142.
IBM TDB, vol. 20, No. 11A, Apr. 1978, entitled "Integrated Module Heat Exchanger" by Antonette et al., p. 4498.

Primary Examiner—John Rivell
Assistant Examiner—L. R. Leo
Attorney, Agent, or Firm—Floyd A. Gonzalez

[57] ABSTRACT

An improved electronic cooling module having thermally optimized and fully integrated vertical water channels located between pistons. The water channels include directed jets matched to the piston localized performance and an inner tube locally attached to the channel hole providing parallel convective surfaces.

21 Claims, 10 Drawing Sheets

FIG. 6A 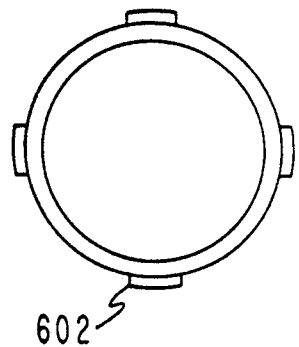 FIG. 6C 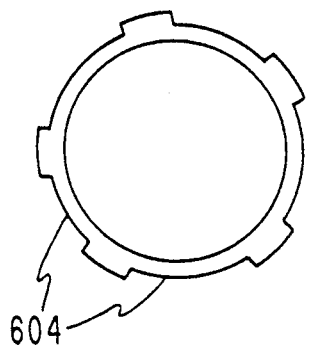 FIG. 6E 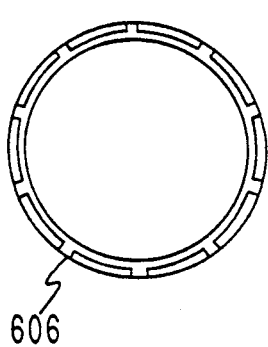
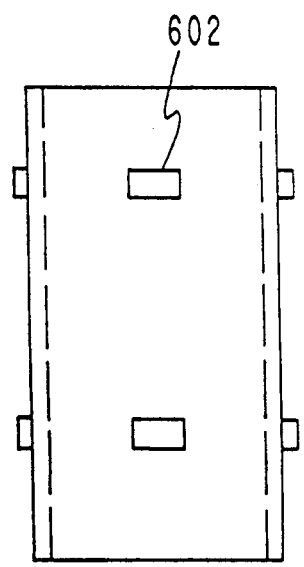 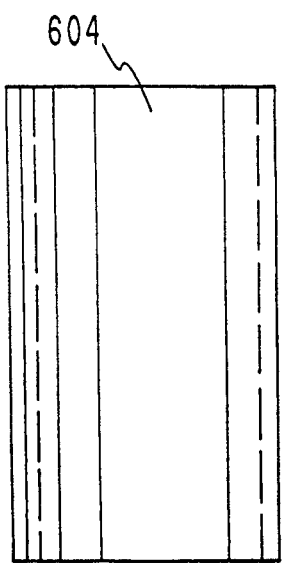 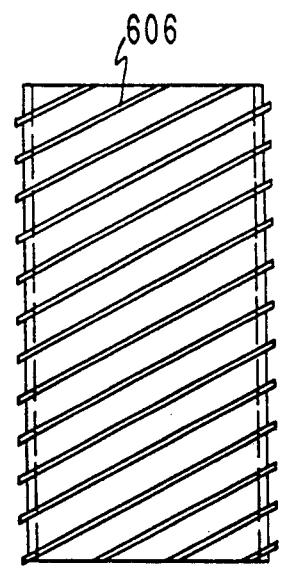
FIG. 6B  FIG. 6D  FIG. 6F

COOLING BY USE OF MULTIPLE PARALLEL CONVECTIVE SURFACES

BACKGROUND OF THE INVENTION

1. Field of the Invention

This invention relates to heat transfer mechanisms and more particularly heat transfer mechanisms for removing the heat generated in an electronic circuit module assembly.

2. Related Art

The efficient extraction of heat from electronic circuit modules for very large scale integrated circuit (VLSI) packages has presented a significant limitation on the design and use of such electronic modules. The power consumed in the integrated circuits generates heat which must in turn be removed from the VLSI package. Lacking an efficient heat transfer mechanism, the speed, reliability and power capabilities of the electronic circuit modules are severely limited. As the density of circuits within VLSI chips has increased, the need for improved heat extraction has become even more acute since the more densely packed chips tend to have a higher need for heat dissipation per unit area.

One conventional means of heat extraction has been through the use of an encapsulated thermal conduction module of the type shown in FIG. 1. The thermal conduction module 10 of FIG. 1 provides cooling of the integrated circuit chips 12 contained therein. The chips 12 are mounted on one side of a substrate 14, generally made of ceramic, which has pins 16 extending from the other side thereof. As is conventional, the integrated circuit chips are arranged on the substrate in a row and column array. The pins 16 provide for the plugging of the module into a board (not shown) which may carry connecting circuitry, etc. A housing cap 18 is attached to the substrate 14 by means of a flange 20 which extends from the periphery of the substrate 14 to the cap 18. The cap 18 is made of a good heat conductive material such as copper or aluminum. The cap 18 has small cylindrical openings 22 located therein, which are arranged in 3 by 3 arrays directly adjacent to the exposed surface of each chip 12. The openings 22 contain pistons 24 opposite each of the chips 12 in the module. The pistons 24 are made of a good heat conducting material such as aluminum or copper or alloys thereof. The cap 18 is in contact with a cold plate 30 which includes a channel 32 suitable for carrying a fluid coolant such as water.

Each of the pistons 24 has a head or header 26 at the end which contacts the surface of the chip 12 when the pin-piston is inserted into the adjacent opening 22 within the housing 18. A spring 27 is included between the housing 18 and the piston 24 to give a small force of the header 26 against the surface of the chip 12. The force exerted by the spring pressure is such that it will not cause the solder balls 28 on which the chips 12 are mounted to change shape.

In operation, heat generated by the chips 12 is extracted by the headers 26 and conducted by the pistons 14 to the cap 18 and the cold plate 30. As coolant flows through the channel 32, it carries away the heat from the cold plate 30, thereby extracting the heat from the integrated circuit chips 12 within the thermal conduction module 10.

While the thermal conduction module of FIG. 1 has provided a good solution to integrated circuit cooling problems, some aspects of the module lend themselves to improvement. In particular, the structural interrelationships between the pistons and the TCM cap can be critical to module performance.

An improvement to the thermal conduction module of FIG. 1 is described in an article entitled Annulus-Convection Vertically Integrated Module Cooling, RESEARCH DISCLOSURE, MARCH 1990, Number 311 (31168). As with the module of FIG. 1, the semiconductor chips are arranged on a substrate in a row and column array. Metal pistons extending from downwardly open cylindrical holes (piston holes) in the hat are pressed against the chip to provide a conduction path for heat transfer from the chips. The pistons are spring loaded in the hat to ensure that the piston chip interface has good thermal contact.

The cooling hardware for the module is made up from a three-tier integrated hat cold plate. The lowest tier (tier-1) is the hat containing the spring loaded pistons. From the substrate side, this hat appears the same as the hat used in other conventional TCMs (such as the TCM of FIG. 1). Tier 1 has upwardly facing cylindrical holes (convection holes) located on the diagonals between the piston holes. These holes form the convective surface for cooling, and like the piston holes, do not extend through the thickness of tier-1. The top surface of tier-1 has fashioned on it distribution vanes, one between each row of holes, which directs the coolant (water) from the holes to a return manifold located at one end of tier-1.

The second tier (tier-2) has on its lower side, coolant injector nozzles which extend downward. When tier-2 is positioned on tier-1, the coolant injector nozzles are each centered in one of the convection holes of tier-1. The top surface of tier-2 has fashioned on it distribution vanes, one for each row of holes (for each injector nozzle), in manner similar to tier-1. The vanes direct the coolant from a supply manifold located at one end of tier-2 (on the opposite end of the return in tier-1) to the coolant injector nozzles. At the end of tier-2 opposite the supply manifold (and directly over the return manifold in tier-1) is located a return port which allows the coolant that collects in the return manifold to pass through, but not mix with the coolant in tier-2. Directly above tier-2 is tier-3, the cover. This tier has as its only feature the supply and return ports of conventional TCMs.

The coolant, when injected into the convection holes, first impinges against the bottom of the cylinder, providing jet impingement heat transfer. It then flows upward in the annulus created by the coolant injector nozzles and the convection surface providing additional heat transfer.

While the module of the above-described article provides an advantage over the module of FIG. 1, there remain a number of areas open for improvement. For example, the module of the above described article provides no direct means for heat to be directly conducted from the chips into the coolant injectors, this, failing to take advantage of potential surfaces to enhance convection cooling. The thermal boundary layer is larger in the above article with heat coming solely from the tier 1 convection holes. In addition, while the above described module takes advantage of jet impingement cooling, it does not match the areas of impingement cooling to the specific highly conductive paths created by tapered type pistons.

SUMMARY OF THE INVENTION

It is an object of the present invention to improve the cooling abilities of a liquid cooled electronic module.

The above object is realized by providing thermally optimized, fully integrated annular vertical coolant channels These channels comprise an inner tube thermally attached to the channel hole thus providing parallel convective surfaces and enhancing the heat transfer. In a preferred embodiment, the channels also comprise directed jets matched to the pistons localized performance.

This present invention can be embodied within modules using various types of piston technologies. For example, the invention can be embodied in modules having tapered or cylindrical pistons with vertical coolant channels located along the chip diagonals; stud type pistons with tapered or cylindrical outside diameters, where vertical water channels are located both near the chip diagonal and inside the stud in the top hat for optimum cooling; and multiple piston arrangements where vertical water channels are located between some or all of the pistons on each chip.

BRIEF DESCRIPTION OF THE DRAWINGS

The present invention will be better understood by reference to the drawings, in which:

FIG. 6A and 6B show top and side views, respectively, of an enhancement to the water channels of FIG. 2;

FIG. 6C and 6D show top and side views, respectively, of an alternative enhancement to the water channels of FIG. 2;

FIG. 6E and 6F show top and side views, respectively, of an another alternative enhancement to the water channels of FIG. 2;

Like reference numerals appearing in more than one FIGURE designate like components.

DESCRIPTION OF THE PREFERRED EMBODIMENTS

The present disclosure relates to an enhanced thermal conduction module (TCM) having an improved integrated cooling channel and an enhanced thermal conduction module (TCM). The improved channel, according to a preferred embodiment, comprises one hole and a tube locally attached to the hat convective surface. The locally attached tube provides added heat transfer surface area, an increased rate of heat transfer per unit area and jet impingement. An additional inner tube may be used to inject coolant into the channel. The channel's low resistance heat paths are matched to the low resistance paths from the chip thru the piston into the hat for optimum performance.

Figure 1:
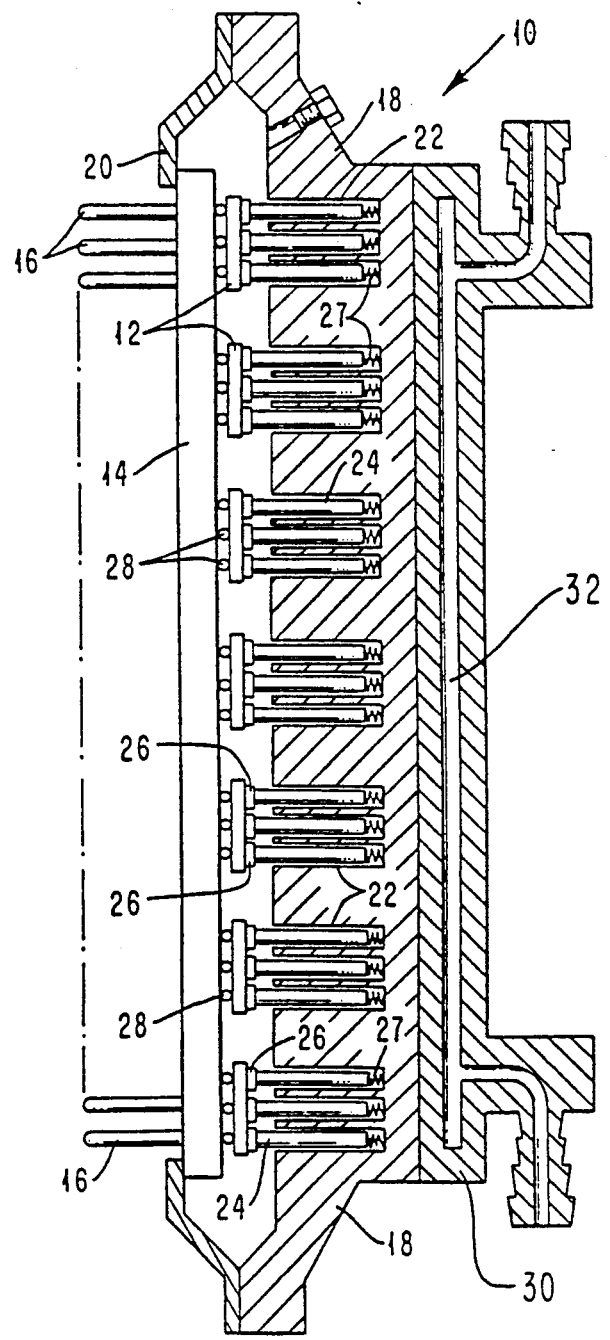
FIG. 1 is an illustration of a prior art thermal conduction module.
Figure 2:
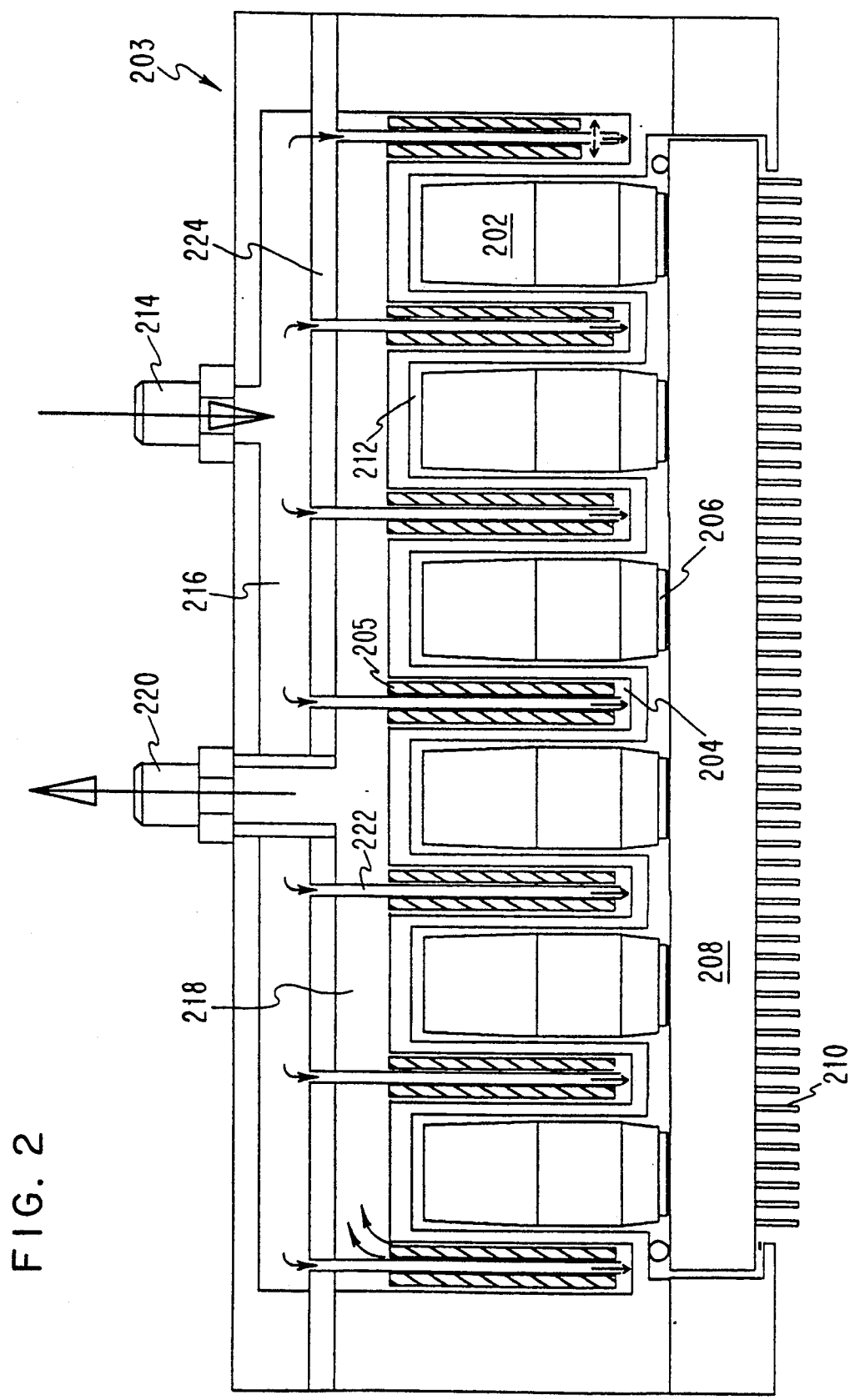
FIG. 2 is a side cutaway view along the chip diagonals of an improved thermal conduction module according to an embodiment of the present invention.

FIG. 2 is a side cutaway view of an improved thermal conduction module according to a first embodiment of the present invention. As is conventional, the module of FIG. 2 includes an array of integrated circuit chips 206 mounted to a substrate 208 by way of solder balls. The substrate 208 includes pins 210 which are used to establish electrical connection to a mother board which provides the interconnection between chips of different modules. A conventional metallic (e.g. copper) heat conductive hat 203 is mounted over the substrate 208. The hat has a plurality of blind holes 212 formed therein, one blind hold being disposed above each chip site. Each blind hole has a single spring loaded piston 202 disposed therein (one per chip site). The pistons 202 are of a conventional barrel shaped (dual tapered) type described, for example, in U.S. Pat. No. 5,005,638.

Also, formed in the hat, in the side opposite the substrate, are parallel convective channels 204 located at the chip diagonals. Within each convective channel 204 is an inner tube (channel tube) 205 which is thermally attached to the walls of the convective channel 204 by metallurgical means such as soldering or brazing or by inducing slight mechanical interferences.

As in conventional, the gaps between the blind holes 212 and the pistons 202, and the gaps between the pistons 202 and the chips 206 are filled with a heat conductive medium such as oil or helium. Providing as thin a wall between the blind piston holes 212 and convective channels 204 as structural rigidity will allow, results in large pistons and a low resistance from each chip 206 to the surface of the blind hole 212 (which receives the corresponding chip-contacting piston). For example, for a TCM made from oxygen free copper, a wall thickness in the 0.5 mm is typical.

The hat 203 of the module of FIG. 2 is also provided with an inlet 214, an upper plasma 216, a lower plenum 218 and an outlet 220. The upper plenum 216 is separated from the lower plenum 218 by a plate 224. Another tube (injector tube) 222 disposed concentrically within each of the inner tubes 205 extends from the plate 224 and is connected to receive the coolant from the upper plenum 216. In operation, a coolant, for example chilled water, (represented by arrows) flows into the inlet 214, is distributed in an upper plenum 216, flows through the injector tube 222, convects in the narrow annuli (formed between the injector tube 222 and the inner tube 205 and between the inner tube 205 and the convective channel 204) and returns to the lower plenum 218 then to the outlet 220.

Figure 3:
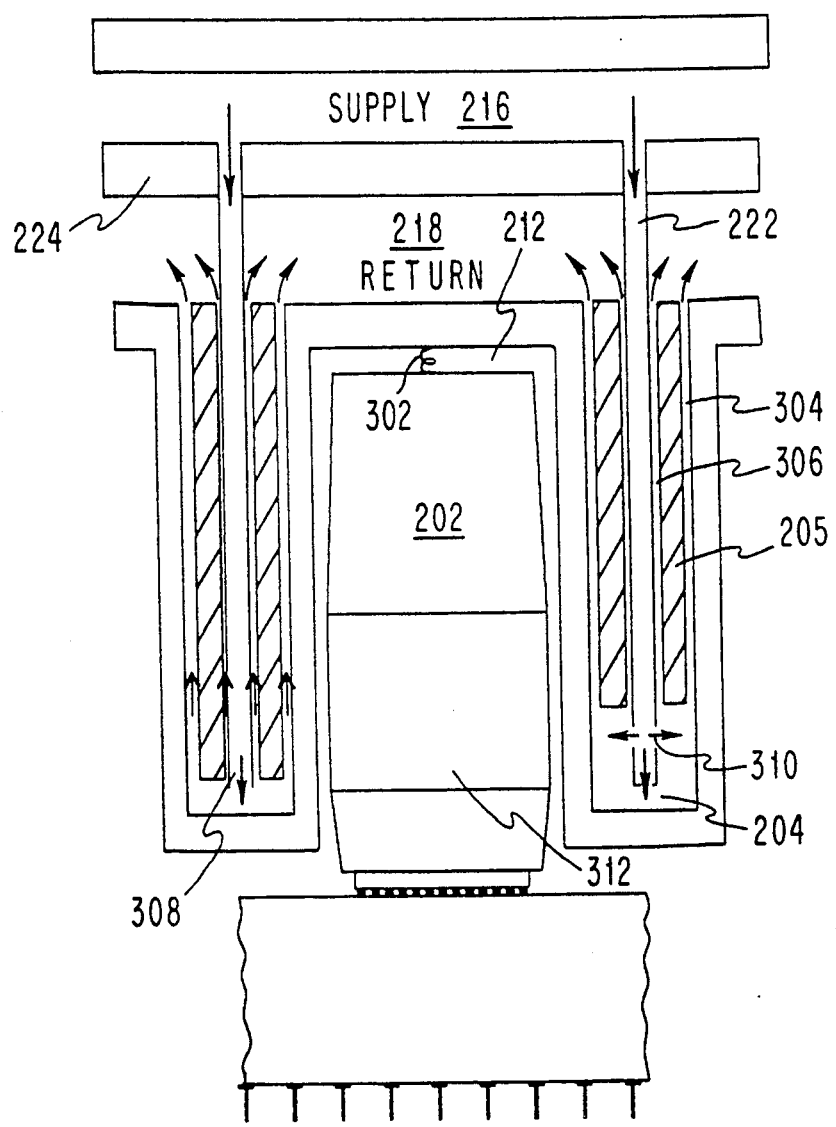
FIG. 3 is a cross sectional view of a single chip site cooled by a tapered piston and water channels according to two alternative embodiments of the present invention.

FIG. 3 is a more detailed, cross sectional view of a single site of the module of FIG. 2. The dual tapered piston 202 in a blind hole 212 is held to a chip 206 by a spring 302. As described with reference to FIG. 2, each convective channel 204 includes an inner tube 205 which is thermally attached to the walls of the convective channel 204. The inner tube 205 can be disposed concentrically within the convective channel 204 or can be offset to direct more coolant towards the high heat flux side of convection hole. The attachment of the inner tube is done locally, preferably over 15 to 30 percent of the circumferential area. The areas of attachment can be continuous or discontinuous axially but in any event, do not block off the axial flow of water in annulus 304 between channel hole 204 and the inner tube 205. The 70 to 85 percent of circumference not thermally attached is convective surface area whose annular gap, preferably 0.05 to 0.2 mm, results in high laminar convection without inducing excessive pressure drop. Advantageously, the discontinuous bonding provides disturbances for mixing the laminar flow.

The thermally attached inner tube 205 is thick walled, for example, 0.5 to 1 mm, so that heat readily conducts from the bonded regions to its two surfaces. Convection occurs from both walls of the annulus 304 between the inner tube 205 and the convective channel 204. By placing the injector tube 222 inside the bonded inner tube 205, heat is also convected into water in a second annulus 306 (formed in between the inner tube 205 and the injector tube 222). The area of the inner annulus 306 (formed between the injector tube 222 and the inner tube 205) is made smaller than the area of the outer annulus 304 (formed between the inner tube 205 and the walls of the convective cooling channel 204), thus forcing more of the water flow into the outer annulus 304 where more heat transfer occurs. Not only does this technique increase convective surface area, but it also raises the Nusselt number in two ways. First, the parallel water paths enable tighter gaps than a single annulus for the same pressure drop and water flow. Also with thermal boundary layers growing from both surfaces in the outer annulus 304, convection is further enhanced. The combined result is a significant improvement in effective resistance from the hat to the water coolant over prior art.

Another feature of the embodiment of FIG. 3 is the jet impingement convection in the bottom of the blind hat hole. As illustrated by the left and right channels, respectively, single jets 308 or multiple jets 310 can be alternatively provided. The jet cooled area can be at the bottom of the hat hole or can include a substantial portion of the side of the hat hole. In the right hand channel of FIG. 3, the jet impingement region and the cylindrical region 312 of the piston are optimally matched such that the highest convection achieved is vertically near where piston to hat gap is small, thereby forming a region of low resistance from chip to coolant. The piston to hat gap is made small by disposing the cylindrical portion of a tapered piston across from the jets.

Figure 4:
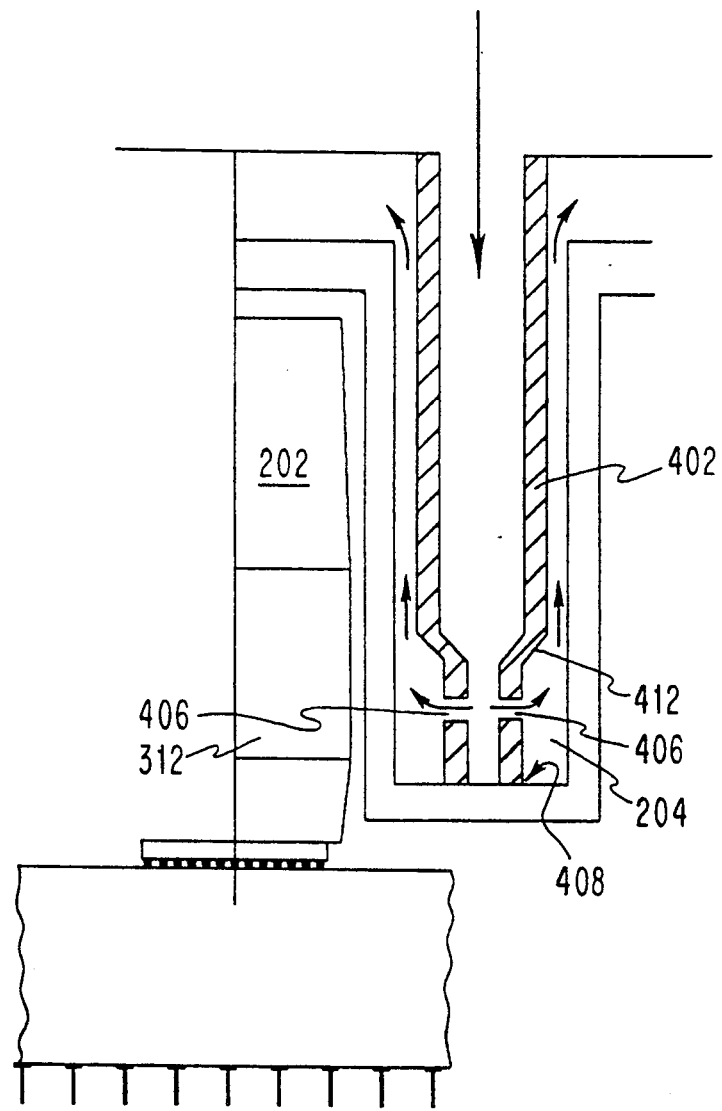
FIG. 4 is a cross sectional view of half a single site with another embodiment of the water channels.

FIG. 4 illustrates an embodiment (showing one half of a site) where a profiled inner tube 402 is bonded to the bottom of the convective cooling channel 204. This arrangement conducts heat into the tube from the end 408 attached to the hat (at the bottom of the cooling channel 204). The coolant exits the tube 402 through the jets 406, impinging near the low resistance path from the cylindrical portion 312 of a dual tapered piston 202 to the inner wall of the convective channel 204. The tube diameter is reduced in the vicinity of jets 406 to reduce pressure drop and enlarge the area cooled by impinging jets. Also, the tube 402 is profiled 412 to reduce entry losses into the developing laminar flow.

Figure 5:
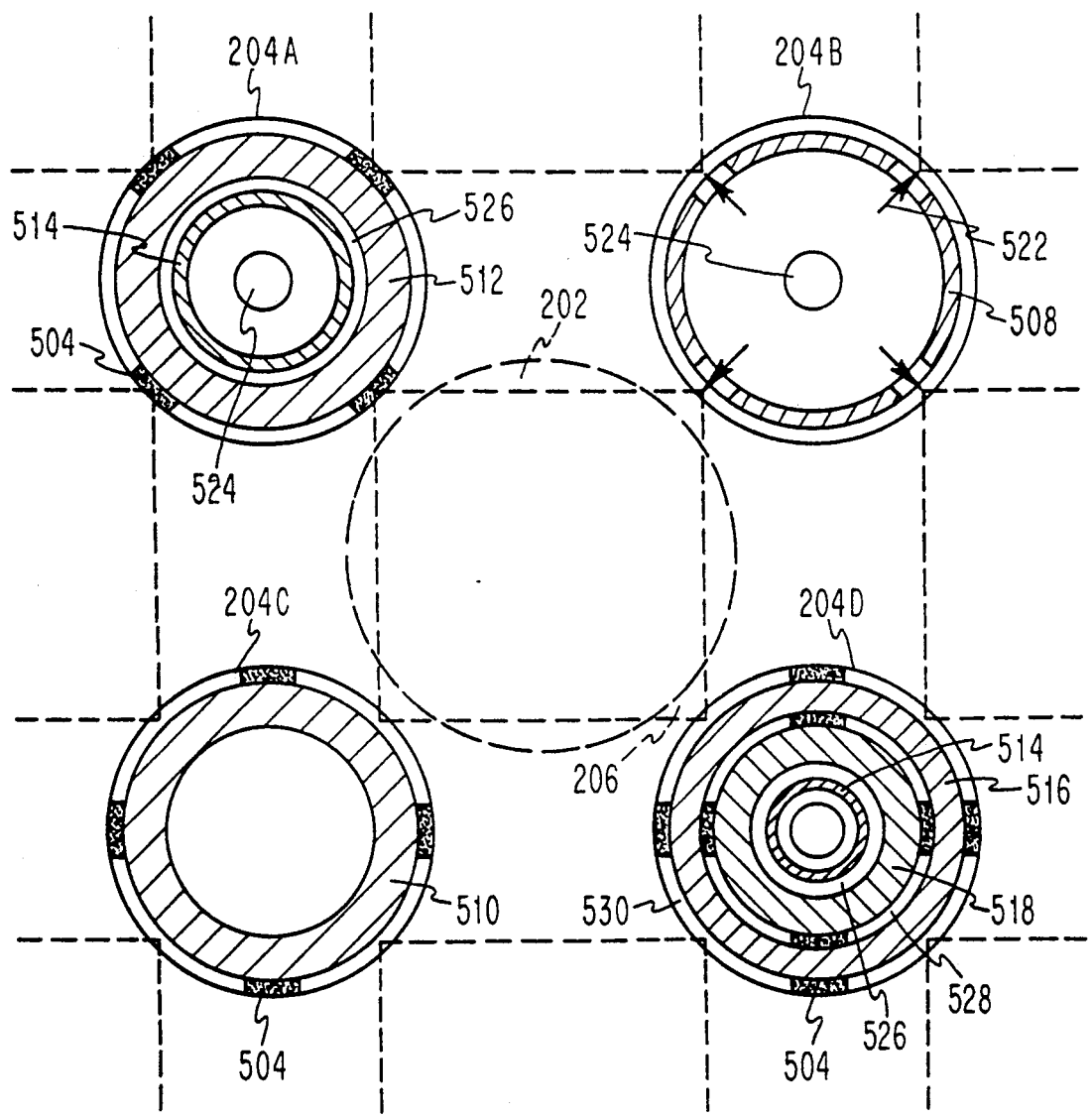
FIG. 5 is a top cutaway view of a single site with four alternative water channels. The dark area represents regions thermally bonded.

FIG. 5 depicts four alternative inner tube embodiments and various means of securing the inner tube within the convective cooling channels. Heat from an electronic chip 206 is removed by a piston 202. Convective cooling channels 204A-D, located at the chip diagonals, are locally bonded 504 to the inner tubes so heat may be conducted across the annuli. The inner tube 508 at the upper right is unattached to the cooling channel 204B and relies on side jets 522, here shown directed at the thin wall region of the hat for lower hat resistance, and bottom jet 524 to augment convection from the walls of convective cooling channel 204B. The inner tube 510 at the bottom left is thermally attached 504 to the cooling channel 204C but has no jet impingement. The cooling channel 204A at the upper left has the same type of attached thick walled inner tube 512 as the site at the lower left, but additionally has thin walled injector tube 514 forming a second annulus 526. The channel 204D at the lower right has two thick walled thermally attached tubes 516, 518 and a thin walled, unattached injector tube 514 for water admission into channel. The result of the above configuration is three concentric annuli 526, 528, 530 and five convective parallel surfaces. In this manner by thermally attaching interior tubes to the walls of water hole, the surface area is increased and the heat is convected from both surfaces of annuli. The attachments are shown in FIG. 5 at different positions relative to the chips to break up developed flow and to optimally transfer heat from the hat into the inner tubes. Multiple annuli in parallel permit tighter gaps with higher rates of heat transfer.

FIGS. 6A-6F are variously top and side view of three enhancements to the outside diameter of of the inner tube. FIGS. 6A and 6B are, respectively top and side views of an inner tube having raised protrusions 602. FIGS. 6C and 6C are, respectively top and side views of an inner tube having axial groves 604. FIGS. 6E and 6F are, respectively top and side views of an inner tube having spiral grooves 606. These enhancements 602-606 serve as regions for local thermal bonding when mechanical interferences means are employed. Also, the above described enhanced inner tube surfaces agitate flow and increase convective surface area for added heat transfer.

Machining methods for the hat and pistons are well known in the art. Tubing can be machined and/or extruded. This tubing can have protrusions as shown in FIG. 6 for positioning the tube in the convection hole. Preferably, the tube is thermally bonded to the convective cooling channel and attached to the plate (224 on FIG. 2) separating the upper plenum 216 from the lower plenum 218 to prevent bypass leakage. Several means provide thermal bonding of the inner tubes to the hat holes and to each other. One such method is to metallurgically bond t tubes to the hat or cooling channel with solder or braze alloy and selectively apply wetting agents to insure only convective regions of annuli are filled with alloy. A complete metallurgical bond is not required for good conduction into the tube because water conducts well across micro gaps. This enables mechanical means such as a slight interference fit between the convective cooling channel and the inner tubes largest outside diameter (OD) to work well.

The joining of the coolant injector tube 222 to the plate 224 separating the supply and return plenums can be accomplished by soldering or brazing after the injector tubes are positioned in the convective channels. Alternatively, thin wall injector tubes, not thermally attached to the convective channel could be made flexible enough to be attached to the plate 224 first and then deflected to a proper position in the convective channel during assembly. Further, for some configurations the injector tubes could be extruded directly from the plate 224.

Figure 7:
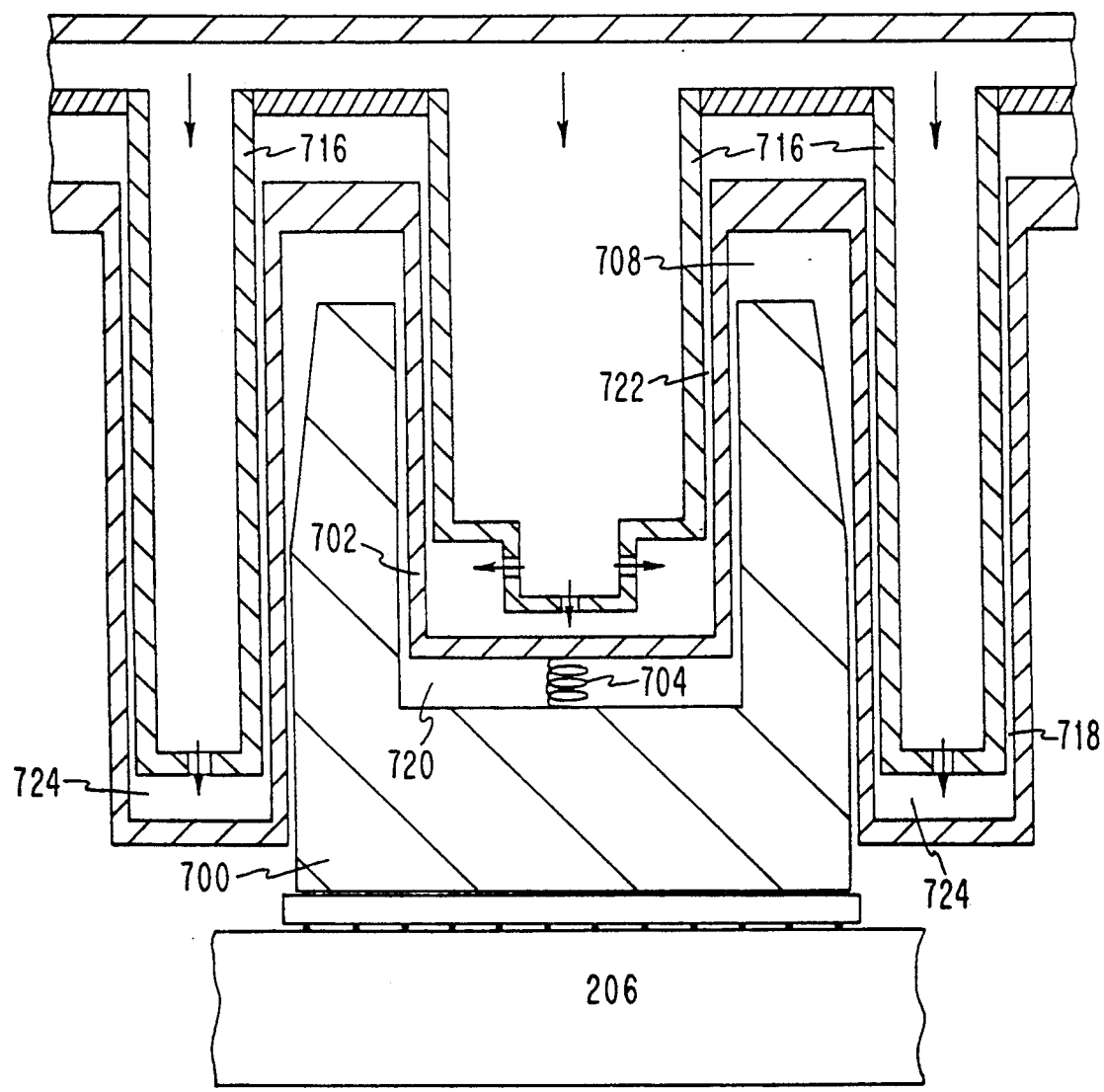
FIG. 7 is a cross sectional view of a single chip site cooled by a stud piston embodiment of the present invention.

FIG. 7 is a cross sectional view of a single chip site in an embodiment of the present invention have stud type pistons. The stud type pistons provide additional performance on large chip sizes by bringing coolant nearer the chip center. In this embodiment, a single tapered stud type piston 700 in each blind hole 708 held to a corresponding chip 706 by a spring 704. The piston 700 has a blind hole 720 in the center which engages with a round stud 702 in the TCM hat. Thermally attached tubes 716 create annuli 718 for coolant flow. Inside the stud 702, an additional water annuli 722, parallel to the channels 724 at the chip diagonals, results. This yields both added convection area and annuli with narrower gaps, creating higher convection rates, due to the parallel flow. Optionally, for very large chips a single piston can have multiple studs and water channels inside each stud.

Figure 8:
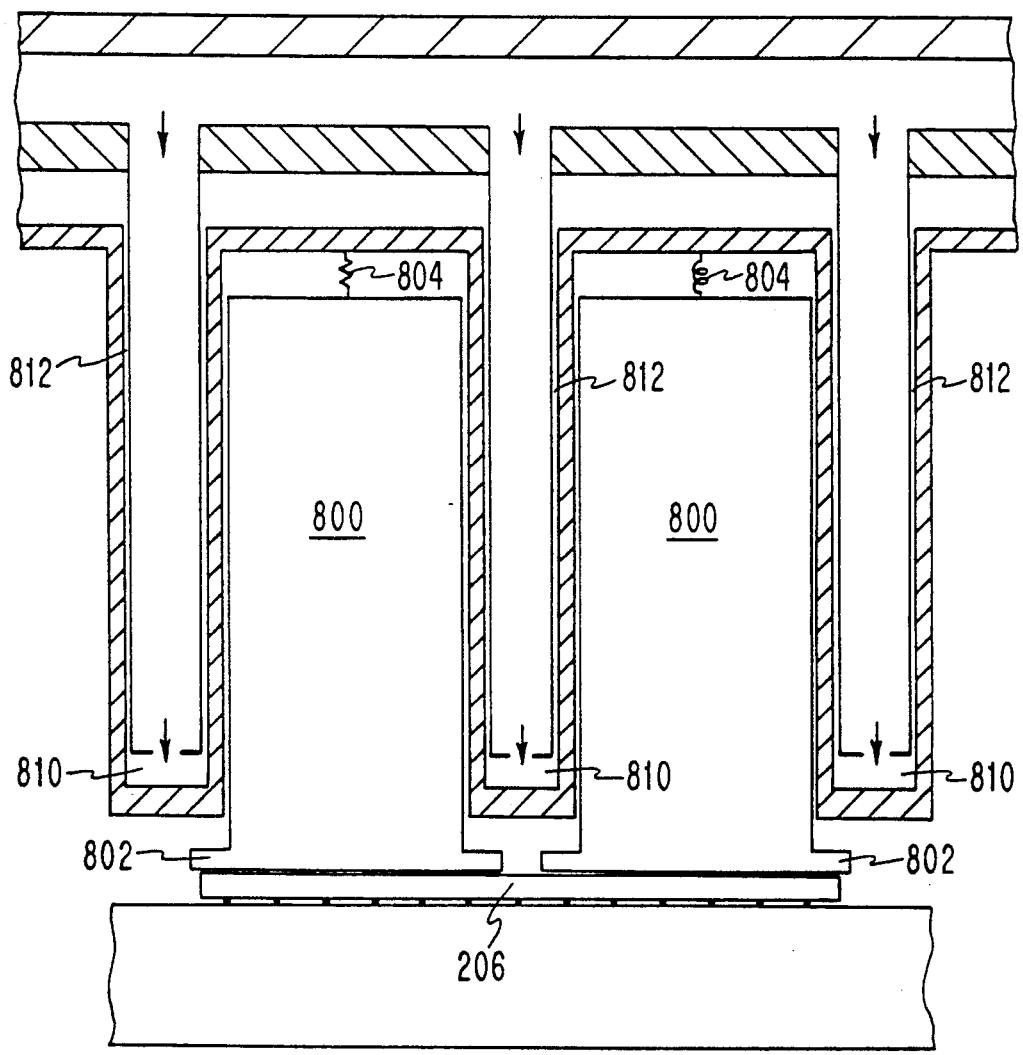
FIG. 8 is a cross sectional view of a single chip site cooled by a four piston embodiment of the present invention.

FIG. 8 is a cross sectional view of a single chip site in a four piston embodiment of the present invention. The pistons 800 are provided with headers 802 to cool a chip 206 in the regions between pistons. Heat is conducted into the top hat from the annuli 812 formed by between the inner tubes and the inner walls of the convective cooling channels 810 (which are disposed diagonally between pistons). Individual springs 804 are provided for each piston. The center water channel carries added heat flow due to its position and provides added convection area, water flow, and number of jets.

Figure 9A:
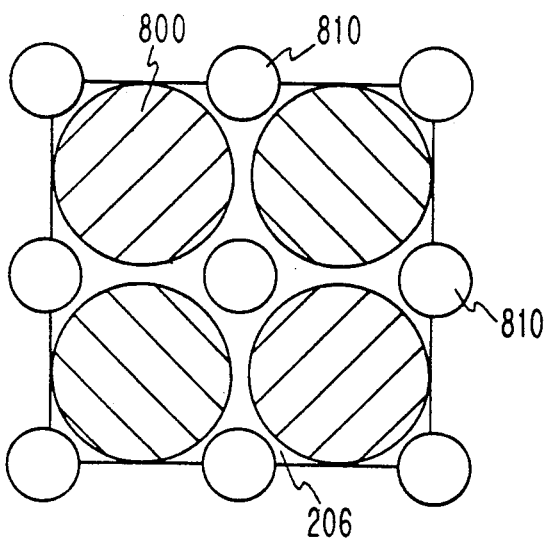
FIGS. 9A-9C are top cutaway views of single chip cites according to various multiple piston embodiments and the multiple water channel embodiments of the present invention.
Figure 9B:
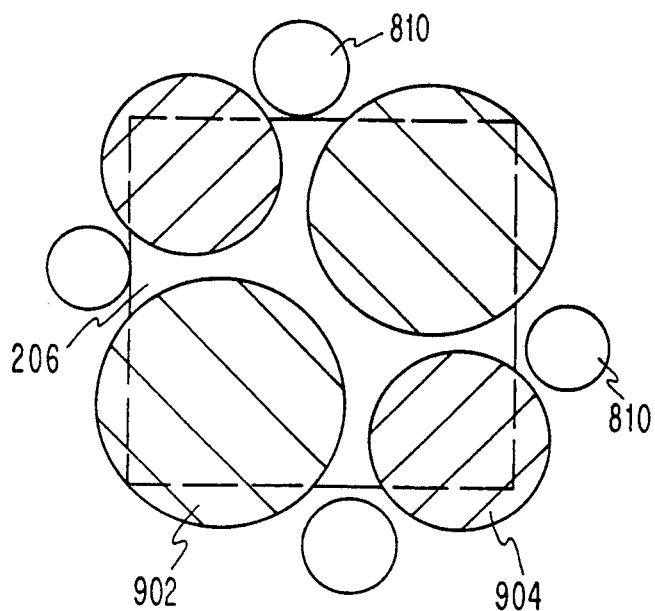
Figure 9C:
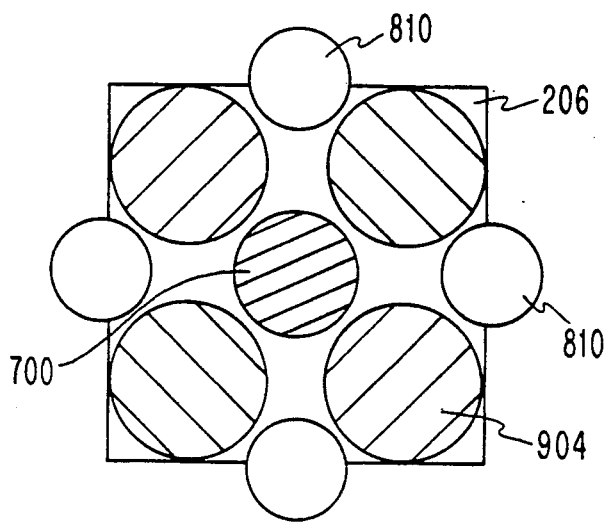

FIGS. 9A-9C are top sectional views of various multiple piston arrangements using improved convective channels 810 as described herein to cool a chip. Specifically, FIG. 9A is a top sectional view of the single chip site the four piston per chip configuration whose cross section is shown in FIG. 8. FIG. 9B shows an alternative four piston arrangement wherein each chip 206 is cooled by various size pistons 902, 904. This configuration requires no headers on pistons. The adjacent chips are mirror images. For very large chips, more than four pistons may be optimal. For instance, FIG. 9C illustrates a five piston embodiment, with the center piston of the stud type.

Figure 10:
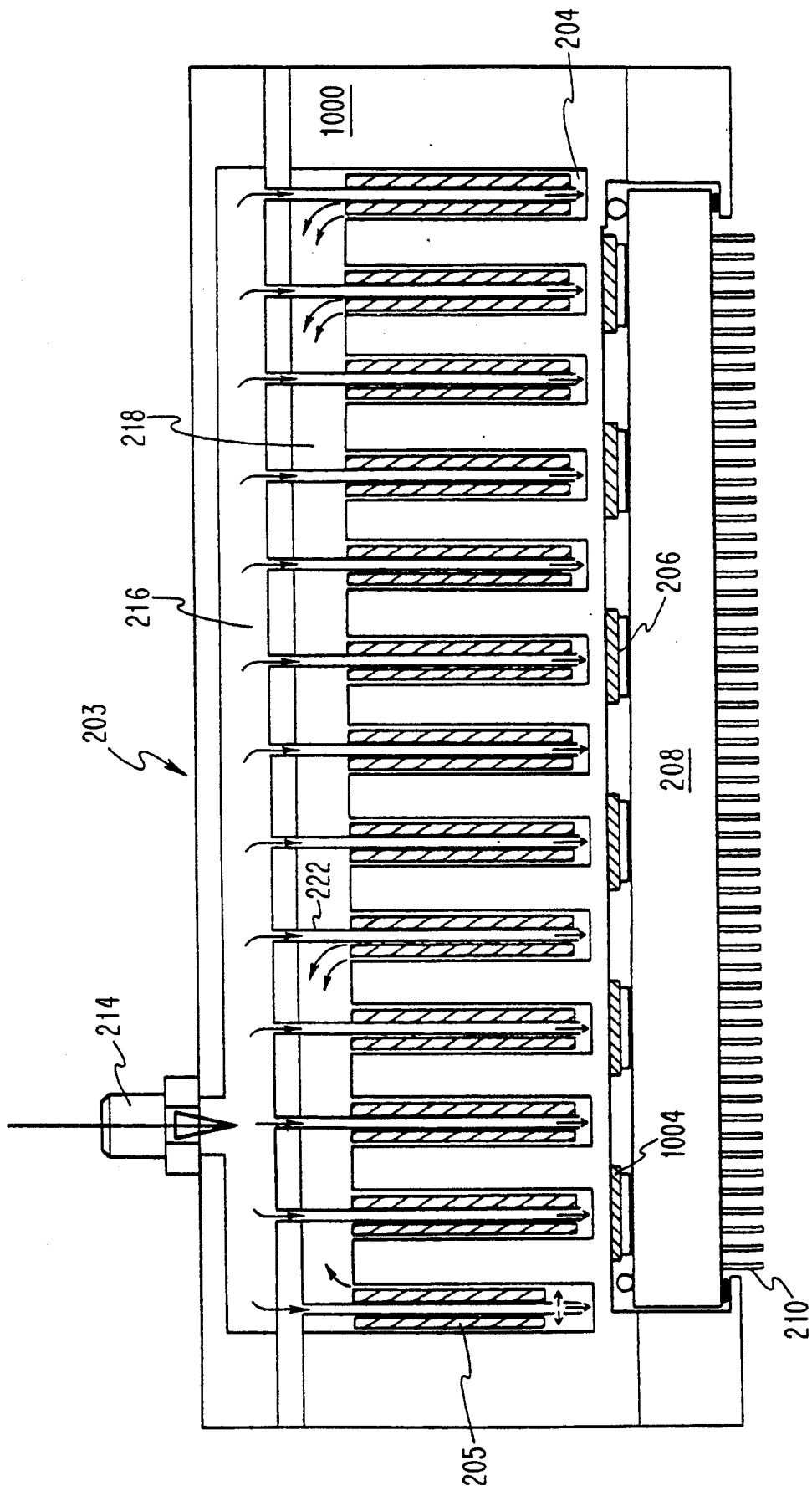
FIG. 10 is a cutaway view of an embodiment of an electronic cooling module having an integral cold plate comprising a plurality parallel annular convective cooling surfaces.

The improved convective channels of the present invention can also be embodied in an improved separable or integral cold plate. FIG. 10 is a cutaway view of an embodiment wherein the cold plate 1000 is integral with the hat 203. Although not shown in this view, a coolant outlet 220 is also provided as shown in the embodiment of FIG. 2. Such an integral cold plate embodiment can be made with or without pistons. In the embodiment of FIG. 10 the thermal interface between the chips 206 and the cold plate 1000 can be established by a thermally conductive pad 1004 or by thermally conductive grease. The convective channels 204, inner tubes 205, and forming a plurality of parallel, annular convective surfaces.

It should be understood that an improved thermal on module according to embodiments of the present invention can be provided uniformly with any single type of improved convective channel as described herein or, alternatively, with a variety of convective channel embodiments. For example, some chip sites may require more cooling than other and thus could be provided with dual or stud tapered type pistons and multiple jets. Other sites which require less cooling could alternatively be provided with cylindrical shaped pistons and a single vertical jet on each diagonal.

Many other modifications and variations that do not depart from the scope and spirit of the invention will now become apparent to those of skill in the art. Thus, it should be understood that the above-described embodiments of the invention have been described by way of example and not as a limitation.

Having thus described our invention, what we claim as new and desire to secure by Letter of Patents is:

1. An electronic cooling module for providing cooling of one or more integrated circuit chips, comprising:
   a housing having a first surface adjacent to said integrated circuit chips and a second surface opposite to said first surface, said housing having a first group of blind holes formed in said first surface and disposed above said integrated circuit chips and a second group of blind holes formed in said second surface and disposed above diagonals of said integrated circuit chips;
   a plurality of pistons, one located in each of said blind holes in said first group and extending therefrom into contact with at least one of said integrated circuit chips;
   a plurality of tubular inserts, one located within each of said blind holes in said second group, each of said tubular inserts being physically and thermally connected to a respective one of said blind holes, and
   a jet plate having a plurality of nozzles extending therefrom, and disposed above said housing such that said nozzles are located within said tubular inserts.

2. The electronic circuit cooling module of claim 1 wherein at least one of said tubular inserts comprises a turbulator disposed on an outer surface thereof.

3. The electronic circuit cooling module of claim 2 wherein said turbulator comprises spiral grooves to turbulate a coolant and edge of grooves in contact with a blind hole in which said at least one of said tubular inserts is disposed.

4. The electronic circuit cooling module of claim 2 wherein said turbulator comprises edges of axial grooves contacting said housing.

5. An electronic circuit cooling module comprising:
   a substrate carrying integrated circuit chips;
   a hat sealingly engaged with the substrate so as to form an enclosed space for said chips, said hat having a first plurality of blind holes formed therein and disposed in between said chips,; said hat further comprising a supply plenum and a distribution plenum formed therein; and a divider disposed between said supply plenum and said distribution plenum;
   a plurality of tubular inserts, one located within each of said blind holes in said first plurality, each of said tubular inserts being physically and thermally connected to a respective one of said blind holes; and
   an array of tubes, each of said tubes having a first end attached to said divider and a second end disposed within a respective one of said tubular inserts.

6. The electronic circuit cooling module of claim 5, wherein:

said hat further comprises a second plurality of blind holes formed therein, each having an opening facing a respective one of said chips;

and further comprising:

a plurality of pistons, one in each of said blind holes in said second plurality.

7. The electronic circuit cooling module of claim 6 wherein at least one of said tubular inserts comprises a jet nozzle aligned to cause jet impingement of a coolant at a region of lowest thermal impedance from said hat to at least one of said pistons.

8. The electronic circuit cooling module of claim 6 wherein each of said pistons is a stud shaped piston comprising a centrally disposed mating hole, and wherein said hat further comprises water channels, one disposed within each of said mating holes, each of said water channels having at least one of said tubular inserts thermally bonded therein.

9. The electronic circuit cooling module of claim 5 wherein each of said blind holes in said first plurality comprise a turbulator disposed on an inner surface thereof.

10. The electronic circuit of claim 5 wherein at least one of said tubular inserts comprises a turbulator disposed on an outer surface thereof.

11. The electronic circuit cooling module of claim 10 wherein said turbulator comprises spiral grooves to turbulate a coolant and edge of grooves in contact with a blind hole in which said at least one of said tubular inserts is disposed.

12. The electronic circuit cooling module of claim 10 wherein said turbulator comprises edges of axial grooves contacting said hat.

13. An electronic cooling module for providing cooling of at least one integrated circuit chip mounted on a substrate, said module comprising:

a hat having essentially cylindrical convective cooling channels formed therein; said hat further comprising a supply plenum and a distribution plenum formed therein; and a divider disposed between said supply plenum and said distribution plenum;

a tubular insert physically and thermally bonded within said convective cooling channels so as to form a first annulus;

a coolant tube having a first end attached to said divider and a second end disposed within said tubular inserts so as to form a second annulus; and wherein when a coolant is supplied to said supply plenum said coolant will flow into said tubular insert, into said convective channel, through said first annulus and said second annulus then into said distribution plenum.

14. The electronic circuit cooling module of claim 13 where said hat further comprises means for sealingly engaging said substrate.

15. The electronic circuit cooling module of claim 14, wherein:

said hat further comprises at least one blind holes formed therein and having an opening facing said chip;

and further comprising:

a heat conductive piston disposed in said blind hole.

16. The electronic circuit cooling module of claim 15 wherein said tubular insert comprises a jet nozzle aligned to cause jet impingement of a coolant at a region of lowest thermal impedance from said hat to said piston.

17. The electronic circuit cooling module of claim 13 wherein said tubular insert comprises a lower portion which is narrower than a top portion thereof.

18. The electronic circuit of claim 13 wherein said tubular insert comprises a turbulator disposed on an outer surface thereof.

19. The electronic circuit cooling module of claim 18 wherein said turbulator comprises spiral grooves to turbulate a coolant and edges of said grooves thermally bonded with said convection cooling channel.

20. The electronic circuit cooling module of claim 18 wherein said turbulator comprises edges of axial grooves contacting said hat.

21. A cold plate for use in an electronic cooling module, said cold plate have a plurality of essentially cylindrical convective cooling holes formed therein, each cooling hole comprising a plurality of parallel annular convective cooling surfaces disposed therein, at least one of said annular convective cooling surfaces being physically and thermally attached to said cold plate at an area within said hole such that a continuous gap is maintained between each of said convective cooling surfaces throughout a depth of said cooling hole, wherein when a coolant is supplied to a center portion of said cooling hole, said coolant will flow through each of said parallel annular convective cooling surfaces.

* * * * *